(12) United States Patent
Chen (10) Patent No.: US 11,303,291 B2
(45) Date of Patent: Apr. 12, 2022

(54) MICROCONTROLLER AND CONTROL METHOD THEREOF

(71) Applicant: Nuvoton Technology Corporation, Hsinchu Science Park (TW)

(72) Inventor: Chien-Jung Chen, Jhubei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 17/135,017

(22) Filed: Dec. 28, 2020

(65) Prior Publication Data

US 2021/0203345 A1 Jul. 1, 2021

(30) Foreign Application Priority Data

Dec. 30, 2019 (TW) ................................. 108148302

(51) Int. Cl.
*H03M 1/12* (2006.01)
*H03M 1/38* (2006.01)

(52) U.S. Cl.
CPC ........... *H03M 1/1245* (2013.01); *H03M 1/38* (2013.01)

(58) Field of Classification Search
CPC .............................. H03M 1/1245; H03M 1/38
USPC .................................................. 341/155, 122
See application file for complete search history.

(56) References Cited

U.S. PATENT DOCUMENTS

| | | | | |
|---|---|---|---|---|
| 7,126,515 B1* | 10/2006 | Kris | ..................... | H03M 1/1215 341/141 |
| 2006/0082481 A1* | 4/2006 | Oprescu | ................ | H03M 3/322 341/122 |
| 2011/0102221 A1* | 5/2011 | Guido | ................. | H03M 1/1225 341/141 |
| 2011/0133974 A1* | 6/2011 | Ono | ..................... | H03M 1/0607 341/172 |

FOREIGN PATENT DOCUMENTS

WO WO 2008/024841 A2 2/2008

OTHER PUBLICATIONS

Taiwanese Office Action in application No. 108148302 dated Jun. 2, 2020; pp. 1-8.
Taiwanese Office Action in application No. 108148302 dated Nov. 6, 2020; pp. 1-7.

* cited by examiner

*Primary Examiner* — Peguy Jean Pierre
(74) *Attorney, Agent, or Firm* — Muncy, Geissler, Olds & Lowe, P.C.

(57) ABSTRACT

A microcontroller including a selection circuit, a sample and hold circuit, an analog-to-digital converter circuit, and a control circuit is provided. The selection circuit provides a first external voltage or a second external voltage as an output voltage according to a selection signal. The sample and hold circuit samples the output voltage according to a turn-on signal to generate an analog input. The analog-to-digital converter circuit converts the analog input to generate a digital output. The control circuit generates the selection signal according to the digital output, adjusts the sampling time, and then generates a turn-on signal according to the sampling time.

20 Claims, 4 Drawing Sheets

MICROCONTROLLER AND CONTROL METHOD THEREOF

CROSS REFERENCE TO RELATED APPLICATIONS

This application claims priority of Taiwan Patent Application No. 108148302, filed on Dec. 30, 2019, the entirety of which is incorporated by reference herein.

BACKGROUND OF THE INVENTION

Field of the Invention

The invention relates to a microcontroller, and more particularly to a microcontroller that is capable of automatically correcting the sampling time.

Description of the Related Art

A conventional microcontroller samples an external signal at fixed sampling times. However, different external peripheral circuits have different capacitor parameters and different resistor parameters. If a conventional microcontroller utilizes a fixed sampling time to sample an external signal, the sample result generated by the conventional microcontroller may be in error.

BRIEF SUMMARY OF THE INVENTION

In accordance with an embodiment of the disclosure, a microcontroller comprises a selection circuit, a sample and hold circuit, an analog-to-digital converter circuit, and a control circuit. The selection circuit provides a first external voltage or a second external voltage as an output voltage according to a selection signal. The sample and hold circuit samples the output voltage according to a turn-on signal to generate an analog input. The analog-to-digital converter circuit converts the analog input to generate a digital output. The control circuit generates the selection signal according to the digital output, adjusts the sampling time, and then generates the turn-on signal according to the sampling time.

In accordance with another embodiment of the disclosure, a control method for a microcontroller is provided. The microcontroller comprises a first channel and a second channel. The first channel is configured to receive a first external voltage. The second channel is configured to receive a second external voltage. The control method comprises sampling the first external voltage according to a sampling time to generate a first digital output; determining whether the first digital output is equal to a first predetermined value; sampling the first external voltage again according to the sampling time in response to the first digital output not being equal to the first predetermined value; sampling the second external voltage according to the sampling time to generate a second digital output in response to the first digital output being equal to the first predetermined value; determining whether the second digital output is equal to a second predetermined value; adjusting the sampling time and sampling the first external voltage according to the adjusted sampling time in response to the second digital output not being equal to the second predetermined value; sampling the first external voltage according to the sampling time to generate a third digital output in response to the second digital output being equal to the second predetermined value; determining whether the third digital output is equal to a third predetermined value; adjusting the sampling time and sampling the first external voltage according to the adjusted sampling time in response to the third digital output not being equal to the third predetermined value; and using the sampling time as a final sampling time in response to the third digital output being equal to the third control circuit.

Control method may be practiced by the microcontroller which have hardware or firmware capable of performing particular functions and may take the form of program code embodied in a tangible media. When the program code is loaded into and executed by an electronic device, a processor, a computer or a machine, the electronic device, the processor, the computer or the machine becomes the microcontroller for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
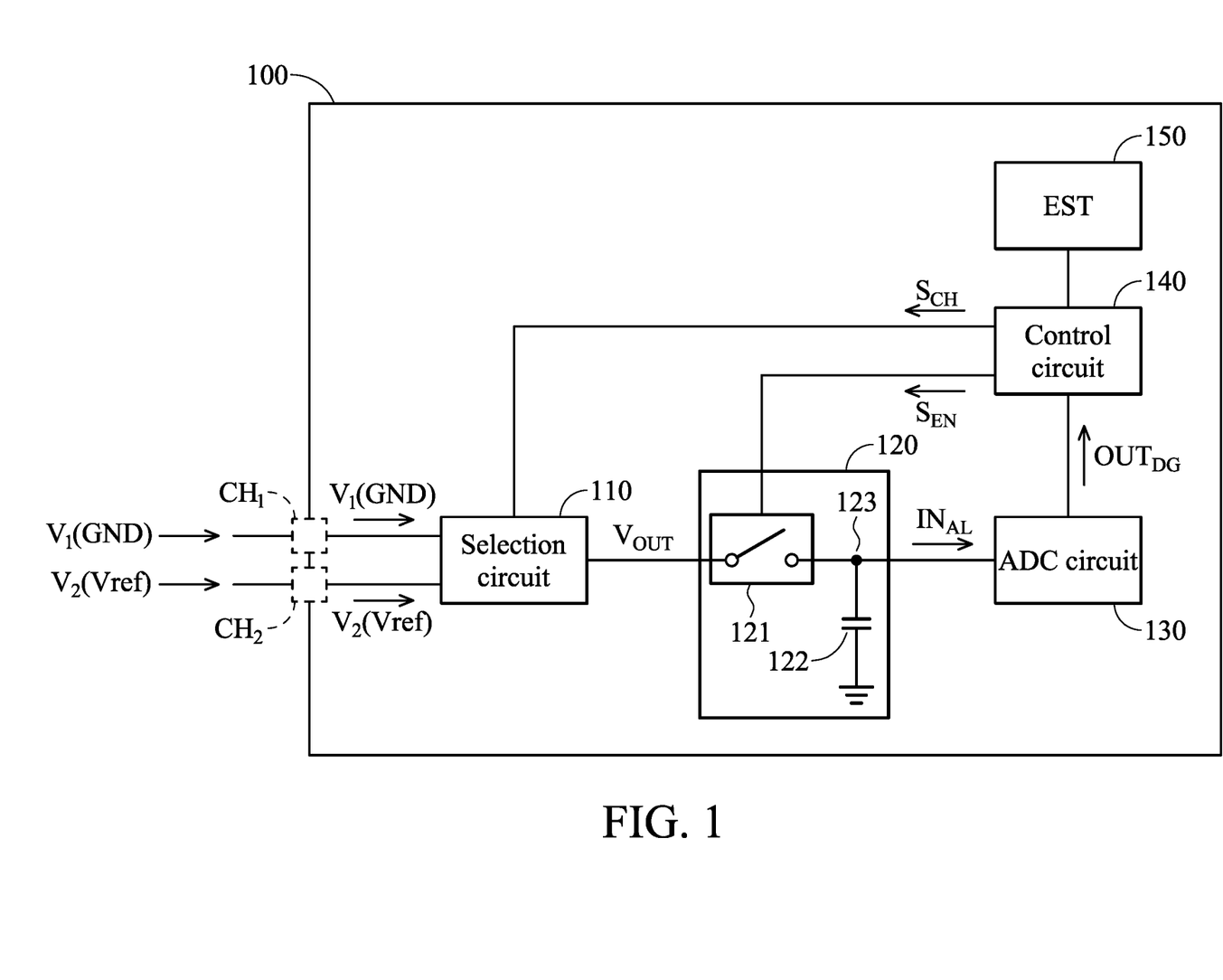
FIG. 1 is a schematic diagram of an exemplary embodiment of a microcontroller, according to various aspects of the present disclosure.

FIG. 1 is a schematic diagram of an exemplary embodiment of a microcontroller, according to various aspects of the present disclosure. The microcontroller 100, such as a MCU, comprises a selection circuit 110, a sample and hold circuit 120, an analog-to-digital converter (ADC) circuit 130 and a control circuit 140. In this embodiment, the microcontroller 100 receives external voltages $V_1$ and $V_2$ via channels $CH_1$ and $CH_2$. In one embodiment, when the microcontroller 100 operates in a correction mode, the external voltage $V_1$ is equal to a ground voltage GND, and the external voltage $V_2$ is equal to a reference voltage Vref. When the microcontroller 100 exits the correction mode and enters a normal working mode, the external voltages $V_1$ and $V_2$ are analog voltages. In this case, the microcontroller 100 converts the external voltages $V_1$ and $V_2$ to digital signals. The number of channels is not limited in the present disclosure. In other embodiment, the microcontroller 100 may comprise more channels to receive more external analog signals. In some embodiments, the microcontroller 100 may receive different analog signals via a single channel in different time points.

The selection circuit 110 provides one of the external voltages $V_1$ and $V_2$ as an output voltage $V_{OUT}$ according to a selection signal $S_{CH}$. The structure of selection circuit 110 is not limited in the present disclosure. In one embodiment, the selection circuit 110 is a multiplexer to select one of input signals (e.g., $V_1$ and $V_2$) and output the selected signal.

The sample and hold circuit 120 samples the output voltage $V_{OUT}$ according to a turn-on signal $S_{EN}$ to generate an analog input $IN_{AL}$. The structure of sample and hold circuit 120 is not limited in the present disclosure. In this embodiment, the sample and hold circuit 120 comprises a transmission circuit 121 and a capacitor 122. When the turn-on signal $S_{EN}$ is asserted, the transmission circuit 121 is turned on to transmit the output voltage $V_{OUT}$ to a node 123. The capacitor 122 samples and holds the voltage of the node 123. The structure of transmission circuit 121 is not limited in the present disclosure. In one embodiment, the transmission circuit 121 is a switch.

The ADC circuit 130 converts the analog input $IN_{AL}$ to generate a digital output $OUT_{DG}$. The structure of ADC circuit 130 is not limited in the present disclosure. In one embodiment, the ADC circuit 130 is a successive-approximation ADC (SAR ADC).

The control circuit 140 generates the selection signal $S_{CH}$ according to the digital output $OUT_{DG}$ and adjusts the sampling value EST. The control circuit 140 control the duration which the turn-on signal $S_{EN}$ is asserted according to the sampling value EST to control the sampling time of the sample and hold circuit 120. In one embodiment, the sampling value EST is stored in the storage circuit 150. In this embodiment, since the control circuit 140 auto-adjusts the sampling value EST, the charging time and the discharging time of the capacitor 122 are not interfered by the parameters of the capacitors and the resistors in different external peripheral circuits.

For example, when a correction signal (not shown) is trigger, the microcontroller 100 enters a correction mode. In the correction mode, the control circuit 140 resets the storage circuit 150 to set the sampling value EST to an initial value. Then, the control circuit 140 enters a first discharge mode to release the charge stored in the capacitor 122 of the sample and hold circuit 120.

In the first discharge mode, the control circuit 140 directs the selection circuit 110 to provide the external voltage $V_1$ transmitted by the channel $CH_1$ to the sample and hold circuit 120. At this time, the external voltage $V_1$ is equal to the ground voltage GND provided by the external peripheral circuits outside of the microcontroller 100. In such cases, the sample and hold circuit 120 samples the ground voltage GND. The control circuit 140 control the duration which the turn-on signal $S_{EN}$ is asserted according to the sampling value EST to control the duration which the transmission circuit 121 is turned on. When the transmission circuit 121 is turned on, the transmission circuit 121 transmits the ground voltage GND to the node 123. The capacitor 122 samples the ground voltage GND to generate the analog input $IN_{AL}$. The ADC circuit 130 converts the analog input $IN_{AL}$ to generate the digital output $OUT_{DG}$. The control circuit 140 determines whether the digital output $OUT_{DG}$ is equal to a first predetermined value. When the digital output $OUT_{DG}$ is not equal to a first predetermined value, it means that the charge of the capacitor 122 has not been completely released. Therefore, the control circuit 140 directs the selection circuit 110 to still provide the ground voltage GND as the output voltage $V_{OUT}$ such that the capacitor 122 still samples the ground voltage GND until the digital output $OUT_{DG}$ is equal to the first predetermined value. When the digital output $OUT_{DG}$ is equal to a first predetermined value, it means that the charge of the capacitor 122 has been completely released. Therefore, the control circuit 140 enters a charge mode. In this embodiment, the first predetermined value is a minimum output digital value (e.g., 0x000) generated by the ADC circuit 130.

In the charge mode, the control circuit 140 directs the selection circuit 110 to provide the external voltage $V_2$ transmitted by the channel $CH_2$ as the output voltage $V_{OUT}$. At this time, the external voltage $V_2$ is equal to a reference voltage Vref. The sample and hold circuit 120 samples the reference voltage Vref. The control circuit 140 controls the duration which the turn-on signal $S_{EN}$ is asserted according to the sampling value EST to adjust the duration which the transmission circuit 121 is turned on. In this case, the capacitor 122 samples the reference voltage Vref to generate the analog input $IN_{AL}$. The ADC circuit 130 converts the analog input $IN_{AL}$ to generate the digital output $OUT_{DG}$. The control circuit 140 determines whether the digital output $OUT_{DG}$ is equal to a second predetermined value. When the digital output $OUT_{DG}$ is not equal to a second predetermined value, it means that the duration which the transmission circuit 121 is turned on is too short such that there is no enough time for the capacitor 122 to sample the reference voltage Vref. Therefore, the control circuit 140 increase the sampling value EST stored in the storage circuit 150 and enters the first discharge mode to release the charge of the capacitor 122 again. In this embodiment, the second predetermined value is a maximum output digital value (e.g., 0xFFF) generated by the ADC circuit 130.

When the control circuit 140 enters the first discharge mode again, the control circuit 140 directs the selection circuit 110 to provide the ground voltage GND transmitted by the channel $CH_1$ to the sample and hold circuit 120. The control circuit 140 control the duration which the transmission circuit 121 is turned on according to the sampling value EST. When the transmission circuit 121 is turned on, the capacitor 122 samples the ground voltage GND to generate the analog input $IN_{AL}$. The ADC circuit 130 converts the analog input $IN_{AL}$ to generate the digital output $OUT_{DG}$. The control circuit 140 determines whether the charge of the capacitor 122 has been completely discharged. When the digital output $OUT_{DG}$ is equal to the first predetermined value, it means that the charge of the capacitor 122 has been completely discharged. Therefore, the control circuit 140 enters the charge mode again. In the charge mode, the control circuit 140 directs the selection circuit 110 to provide the external voltage $V_2$ (e.g., the reference voltage Vref) of the channel $CH_2$ as the output voltage $V_{OUT}$. At this time, the control circuit 140 asserts the turn-on signal $S_{EN}$ according to the sampling value EST stored in the storage circuit 150. Since the sampling value EST is increased in the charge mode, the duration which the transmission circuit 121 transmits the reference voltage Vref to the node 123 is also increased. Therefore, the time during which the capacitor 122 samples the reference voltage Vref is also increased. The ADC circuit 130 converts the sample result of the capacitor 122 into the digital output $OUT_{DG}$. The control circuit 140 determines whether the time during which the capacitor 122 samples the reference voltage Vref is enough. When the digital output $OUT_{DG}$ is not equal to the second predetermined value, it means that the time during which the capacitor 122 samples the reference voltage Vref is not enough. Therefore, the control circuit 140 increases the sampling value EST stored in the storage circuit 150 and enters the first discharge mode again. However, when the digital output $OUT_{DG}$ is equal to the second predetermined value, it means that the time during which the capacitor 122 samples the reference voltage Vref is enough. Therefore, the control circuit 140 enters a second discharge mode.

In the second discharge mode, the control circuit 140 directs the selection circuit 110 to provide the external voltage $V_1$ (i.e., the ground voltage GND) of the channel $CH_1$ as the output voltage $V_{OUT}$ and turns on the transmission circuit 121 according to the sampling value EST. The capacitor 122 samples the ground voltage GND. The ADC circuit 130 converts the sampled result of the capacitor 122 to generate the digital output $OUT_{DG}$. In this case, the control circuit 140 determines whether the digital output $OUT_{DG}$ is equal to a third predetermined value. When the digital output $OUT_{DG}$ is not equal to a third predetermined value, it means that the charge of the capacitor 122 has not been completely discharged. Therefore, the control circuit 140 increases the sampling value EST stored in the storage circuit 150 and enters the first discharge mode again to discharge the charge of the capacitor 122 again. When the digital output $OUT_{DG}$ is equal to a third predetermined value, it means that the charge of the capacitor 122 has been completely released. Therefore, the control circuit 140 stops adjusting the sampling value EST stored in the storage circuit 150. At this time, the sampling value EST is referred to as a final sampling value or a final sampling time. After the microcontroller 100 enters a normal working mode, the control circuit 140 controls the duration which the transmission circuit 121 is turned on according to the final sampling value. In one embodiment, the third predetermined value is equal to the first predetermined value.

In other embodiments, the sampling value EST set by the control circuit 140 in the charge mode is referred to as a charge value which indicates the charge time for the capacitor 122. In the second discharge mode, the control circuit 140 may initialize a discharge value and then adjust the discharge value according to the digital output $OUT_{DG}$. The initialized discharge value may be 0. When the digital output $OUT_{DG}$ is not equal to the third predetermined value, the control circuit 140 increases the discharge value, such as from 0 to 1 and enters the first discharge mode to discharge the charge of the capacitor 122 again. In such cases, when the control circuit 140 enters the second discharge mode again, the control circuit 140 does not initialize the discharge value. At this time, the control circuit 140 may directly adjust the discharge value according to the digital output $OUT_{DG}$. For example, if the digital output $OUT_{DG}$ is not equal to the third predetermined value, the control circuit 140 increases the discharge value, such as from 1 to 2 and then enters the first discharge mode again. However, when the digital output $OUT_{DG}$ is equal to the third predetermined value, the control circuit 140 stops adjusting the discharge value. In this case, when the microcontroller 100 enters the normal working mode, the control circuit 140 reads the discharge value or the charge value stored in the storage circuit 150 according to an external voltage to control the sampling time of the sample and hold circuit 120. For example, if the external voltage is large, the control circuit 140 controls the sampling time of the sample and hold circuit 120 according to the charge value. If the external voltage is small, the control circuit 140 controls the sampling time of the sample and hold circuit 120 according to the discharge value.

In the correction mode, the sample and hold circuit 120 samples the reference voltage Vref and the ground voltage GND. At this time, the reference voltage Vref and the ground voltage GND sampled by the sample and hold circuit 120 are provided from the external peripheral circuits outside of the microcontroller 100. The reference voltage Vref and the ground voltage GND reflect the capacitor parameters and the resistor parameters of the external peripheral circuits. Therefore, when the control circuit 140 adjusts the sampling value EST according to the sampled result of the sample and hold circuit 120, the sampling time of the sample and hold circuit 120 can match the capacitor parameters and the resistor parameters of the external peripheral circuits. When the microcontroller 100 enters a normal working mode, the internal ADC circuit 130 can generate the correct digital output $OUT_{DG}$.

Figure 2:
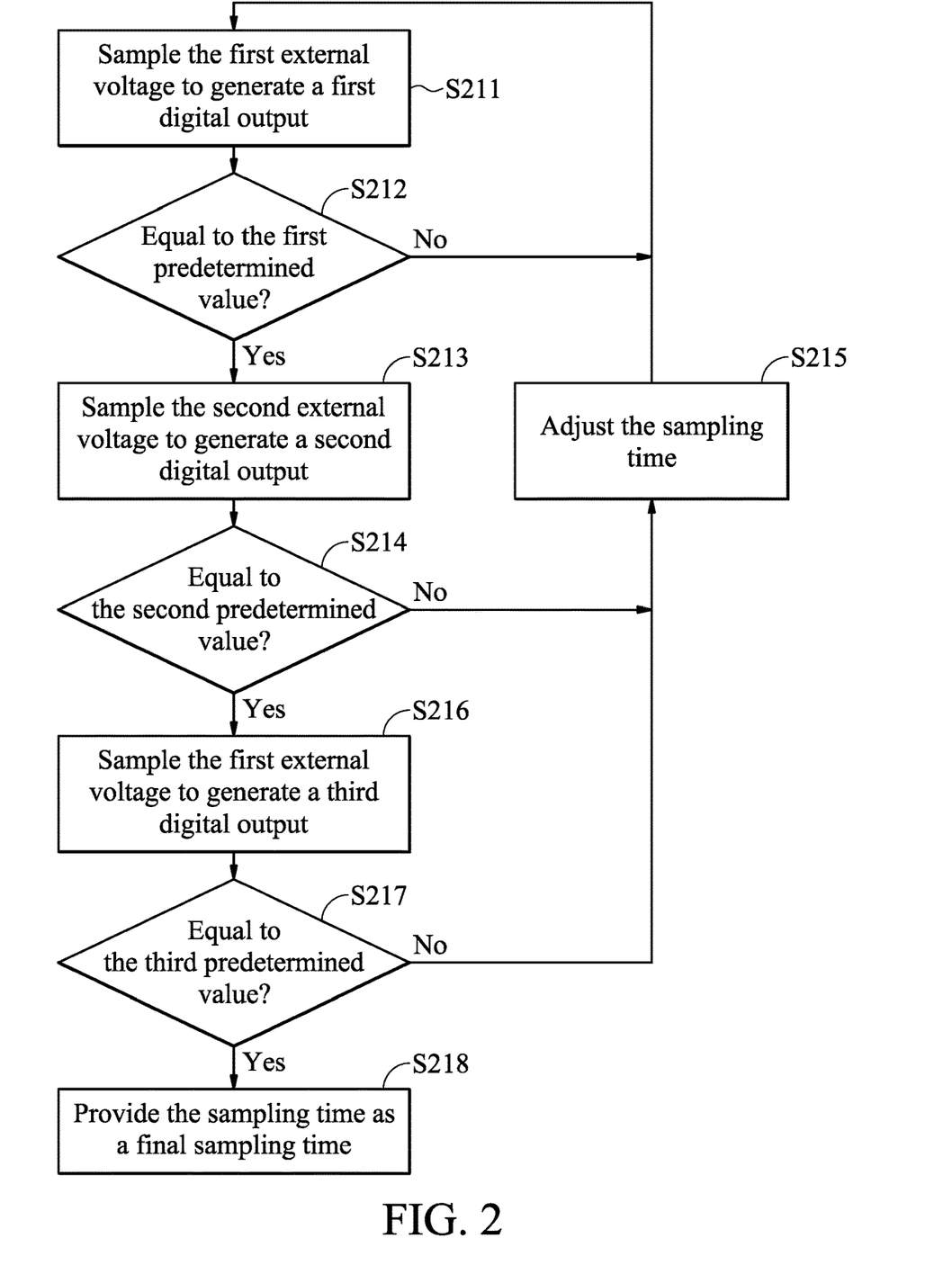
FIG. 2 is a flowchart of an exemplary embodiment of a control method, according to various aspects of the present disclosure.

FIG. 2 is a flowchart of an exemplary embodiment of a control method, according to various aspects of the present disclosure. The control method is applied in a microcontroller to adjust an internal sampling time. The microcontroller comprises a first channel and a second channel. The first channel is configured to receive a first external voltage. The second channel is configured to receive a second external voltage. First, the first external voltage is sampled according to a sampling time to generate a first digital output (step S211). In one embodiment, the first external voltage is a ground voltage. In other embodiments, before step S211, the sampling time is equal to an initial value, such as 0.

Then, a determination is made as to whether the first digital output is equal to a first predetermined value (step S212). When the first digital output is not equal to the first predetermined value, step S211 is performed to sample the first external voltage again according to the sampling time. When the first digital output is equal to the first predetermined value, the second external voltage is sampled to generate a second digital output (step S213). In one embodiment, the second external voltage is a reference voltage larger than the ground voltage.

A determination is made as to whether the second digital output is equal to a second predetermined value (step S214). When the second digital output is not equal to the second predetermined value, the sampling time is adjusted (step S215). The adjusted sampling time is used to sample the first external voltage to generate a new first digital output (step S211). Then, a determination is made as to whether the new first digital output is equal to the first predetermined value (step S212). In one embodiment, step S215 is to increase the sampling time. In some embodiments, the second predetermined value is greater than the first predetermined value.

When the second digital output is equal to the second predetermined value, the first external voltage is sampled according to the sampling time to generate a third digital output (step S216). In one embodiment, the first external voltage is equal to a ground voltage. Then, a determination is made as to whether the third digital output is equal to a third predetermined value (step S217). In one embodiment, the third predetermined value is equal to the first predetermined value.

When the third digital output is not equal to the third predetermined value, the sampling time is adjusted again (step S215) and the adjusted sampling time is used to sample the first external voltage again to generate a new first digital output (step S211). The new first digital output is determined whether to equal to the first predetermined value (step S212). However, when the third digital output is equal to the third predetermined value, the sampling time is served as a final sampling time (step S218). In one embodiment, when the microcontroller enters a normal working mode, the microcontroller samples the external voltages in the first and second channels according to the final sampling time.

In other embodiments, when a correction signal is triggered, the microcontroller enters a correction mode. In the correction mode, the microcontroller performs steps S211~S218 to correct the sampling time.

Figure 3:
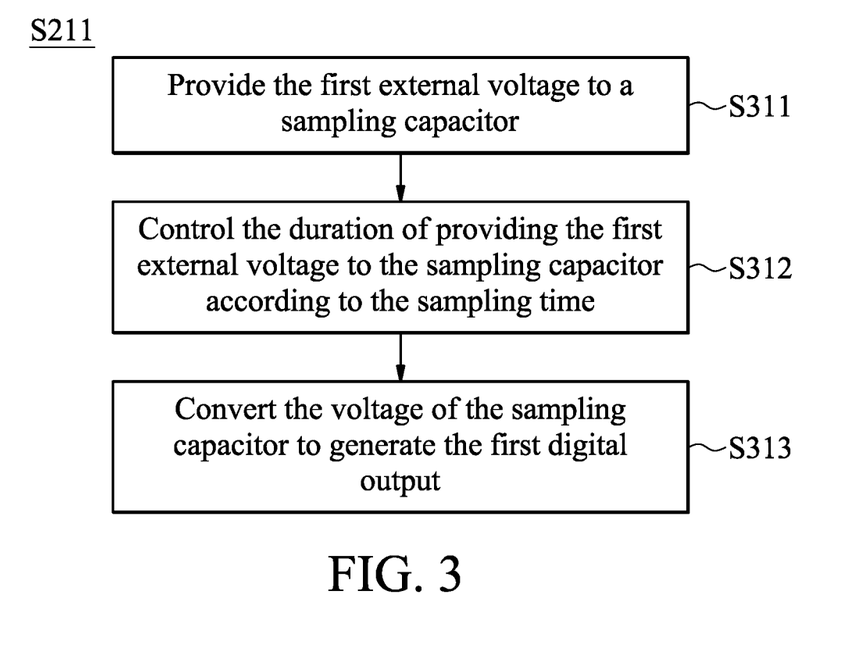
FIG. 3 is a schematic diagram of an exemplary embodiment of step S211 of FIG. 2, according to various aspects of the present disclosure.

FIG. 3 is a schematic diagram of an exemplary embodiment of step S211 of FIG. 2, according to various aspects of the present disclosure. First, the first external voltage is provided to a sampling capacitor (step S311). In one embodiment, step S311 is to turn on a transmission circuit to transmit the first external voltage to the sampling capacitor. In this embodiment, the sampling capacitor is disposed in the microcontroller.

Next, the duration of providing the first external voltage to the sampling capacitor is controlled according to the sampling time (step S312). In this embodiment, step S312 is to use the sampling time to control the duration when the transmission circuit is turned on. For example, with increase of the sampling time, the duration when the transmission circuit is turned on is increased. With decrease of the sampling time, the duration when the transmission circuit is turned on is reduced.

The voltage of the sampling capacitor is converted to generate the first digital output (step S313). In one embodiment, step S313 is to enable an ADC circuit to convert the voltage of the sampling capacitor from an analog format into a digital format. The kind of ADC circuit is not limited in the present disclosure. In one embodiment, the ADC circuit is a SAR ADC.

Figure 4:
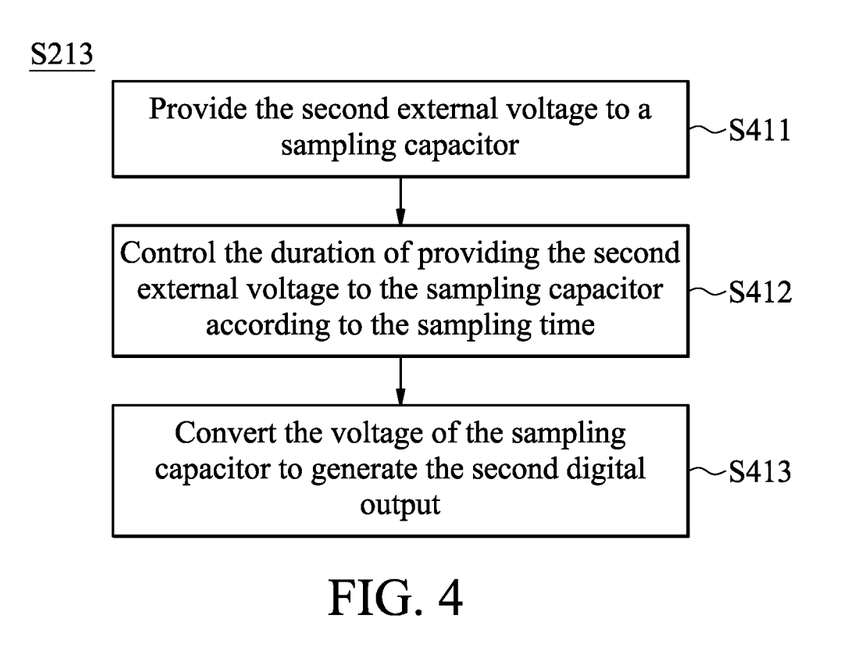
FIG. 4 is a schematic diagram of an exemplary embodiment of step S213 of FIG. 2, according to various aspects of the present disclosure.

FIG. 4 is a schematic diagram of an exemplary embodiment of step S213 of FIG. 2, according to various aspects of the present disclosure. First, the second external voltage is provided to the sampling capacitor (step S411). In one embodiment, step S411 is to utilize a transmission circuit to transmit the second external voltage to the sampling capacitor. Then, the duration which the second external voltage is provided to the sampling capacitor is controlled according to the sampling time (step S412). In one embodiment, step S412 is also to use the sampling time to control the duration which the transmission circuit is turned on. The voltage of the sampling capacitor is converted to generate the second digital output (step S413). In this embodiment, step S413 is to enable an ADC circuit to convert the voltage of the sampling capacitor from an analog format into a digital format.

Figure 5:
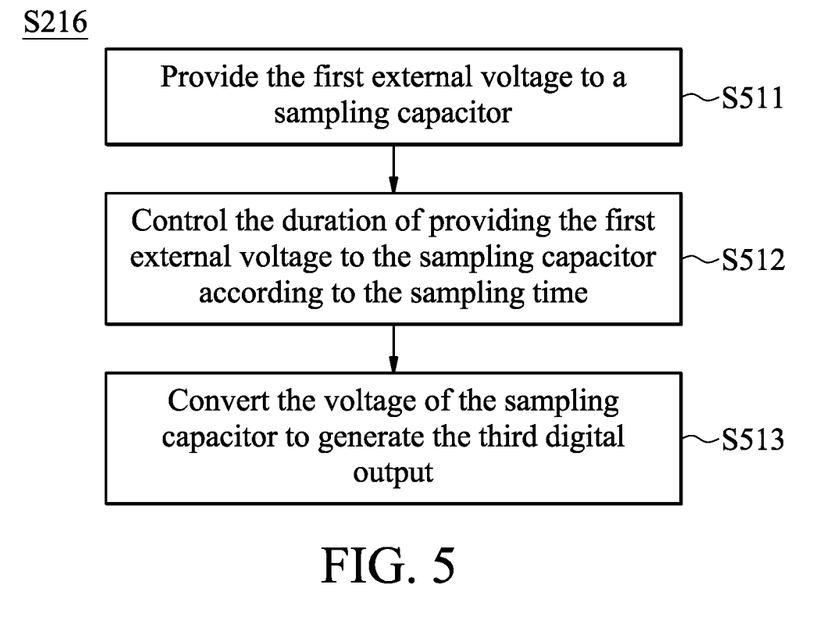
FIG. 5 is a schematic diagram of an exemplary embodiment of step S216 of FIG. 2, according to various aspects of the present disclosure.

FIG. 5 is a schematic diagram of an exemplary embodiment of step S216 of FIG. 2, according to various aspects of the present disclosure. First, the first external voltage is provided to the sampling capacitor (step S511). In one embodiment, step S511 is to use a transmission circuit to transmit the first external voltage to the sampling capacitor again. Then, the duration when the first external voltage is provided to the sampling capacitor is controlled according to the sampling time (step S512). In one embodiment, step S512 is also to use the sampling time to control the duration which the transmission circuit is turned on. Next, the voltage of the sampling capacitor is converted to generate the third digital output (step S513). In this embodiment, step S513 is to enable an ADC circuit to convert the voltage of the sampling capacitor from an analog format into a digital format.

The control method, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a microcontroller for practicing the method. The method may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a microcontroller for practicing the disclosed method. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A microcontroller comprising:
    a selection circuit providing a first external voltage or a second external voltage as an output voltage according to a selection signal;
    a sample and hold circuit sampling the output voltage according to a turn-on signal to generate an analog input;
    an analog-to-digital converter circuit converting the analog input to generate a digital output; and
    a control circuit generating the selection signal according to the digital output, adjusting a sampling time, and then generating the turn-on signal according to the sampling time,
    wherein:
    in a first discharge mode, the control circuit directs the selection circuit to provide the first external voltage as the output voltage and determines whether the digital output is equal to a first predetermined value,
    in response to the digital output not being equal to the first predetermined value, the control circuit directs the selection circuit to provide the first external voltage as the output voltage again, and in response to the digital output being equal to the first predetermined value, the control circuit enters a charge mode,
    in the charge mode, the control circuit directs the selection circuit to provide the second external voltage as the output voltage.

2. The microcontroller as claimed in claim 1, further comprising:
   a first channel configured to receive the first external voltage;
   a second channel configured to receive the second external voltage; and
   a storage circuit configured to store the sampling time.
3. The microcontroller as claimed in claim 2, wherein:
   in a correction period, the control circuit resets the storage circuit to set the sampling time to an initial value and enters the first discharge mode.
4. The microcontroller as claimed in claim 3, wherein:
   in the charge mode, the control circuit determines whether the digital output is equal to a second predetermined value, and
   in response to the digital output not being equal to the second predetermined value, the control circuit increases and stores the sampling time and enters the first discharge mode.
5. The microcontroller as claimed in claim 4, wherein:
   in response to the digital output being equal to the second predetermined value, the control circuit enters a second discharge mode,
   in the second discharge mode, the control circuit directs the selection circuit to provide the first external voltage as the output voltage and determines whether the digital output is equal to a third predetermined value, and
   the third predetermined value is equal to the first predetermined value, and the second predetermined value is greater than the first predetermined value.
6. The microcontroller as claimed in claim 5, wherein in response to the digital output not being equal to the third predetermined value, the control circuit increases and stores the sampling time and enters the first discharge mode.
7. The microcontroller as claimed in claim 6, wherein in response to the digital output being equal to the third predetermined value, the control circuit uses the sampling time as a final sampling value.
8. The microcontroller as claimed in claim 7, wherein in a working period, the control circuit generates the turn-on signal according to the final sampling value.
9. The microcontroller as claimed in claim 1, wherein the sample and hold circuit comprises:
   a transmission circuit configured to transmit the output voltage to a node; and
   a capacitor configured to sample and hold the voltage of the node.
10. The microcontroller as claimed in claim 1, wherein the analog-to-digital converter circuit is a successive-approximation analog-to-digital converter.
11. A control method for a microcontroller comprising a first channel and a second channel, wherein the first channel is configured to receive a first external voltage, and the second channel is configured to receive a second external voltage, comprising:
    sampling the first external voltage according to a sampling time to generate a first digital output;
    determining whether the first digital output is equal to a first predetermined value;
    sampling the first external voltage again according to the sampling time in response to the first digital output not being equal to the first predetermined value;
    sampling the second external voltage according to the sampling time to generate a second digital output in response to the first digital output being equal to the first predetermined value;
    determining whether the second digital output is equal to a second predetermined value;
    adjusting the sampling time and sampling the first external voltage according to the adjusted sampling time in response to the second digital output not being equal to the second predetermined value;
    sampling the first external voltage according to the sampling time to generate a third digital output in response to the second digital output being equal to the second predetermined value;
    determining whether the third digital output is equal to a third predetermined value;
    adjusting the sampling time and sampling the first external voltage according to the adjusted sampling time in response to the third digital output not being equal to the third predetermined value; and
    using the sampling time as a final sampling time in response to the third digital output being equal to the third control circuit.
12. The control method as claimed in claim 11, wherein the step of adjusting the sampling time and sampling the first external voltage according to the adjusted sampling time in response to the second digital output not being equal to the second predetermined value comprises:
    sampling the first external voltage according to the adjusted sampling time to generate a fourth digital output;
    determining whether the fourth digital output is equal to the first predetermined value;
    sampling the first external voltage again according to the adjusted sampling time in response to the fourth digital output not being equal to the first predetermined value; and
    sampling the second external voltage according to the adjusted sampling time to generate the second digital output in response to the fourth digital output being equal to the first predetermined value.
13. The control method as claimed in claim 11, wherein the step of sampling the first external voltage according to a sampling time to generate a first digital output comprises:
    providing the first external voltage to a sampling capacitor;
    controlling the duration of providing the first external voltage to the sampling capacitor according to the sampling time; and
    transforming the voltage of the sampling capacitor to generate the first digital output.
14. The control method as claimed in claim 13, wherein the step of sampling the second external voltage according to the sampling time to generate a second digital output in response to the first digital output being equal to the first predetermined value comprises:
    providing the second external voltage to the sampling capacitor;
    controlling the duration of providing the second external voltage to the sampling capacitor according to the sampling time; and
    transforming the voltage of the sampling capacitor to generate the second digital output.
15. The control method as claimed in claim 14, wherein the step of sampling the first external voltage according to the sampling time to generate a third digital output in response to the second digital output being equal to the second predetermined value comprises:
    providing the first external voltage to the sampling capacitor; and controlling the duration of providing the first external voltage to the sampling capacitor according to the sampling time; and transforming the voltage of the sampling capacitor to generate the third digital output.

16. The control method as claimed in claim 15, wherein the first external voltage is less than the second external voltage.

17. The control method as claimed in claim 11, wherein in response to the second digital output not being equal to the second predetermined value, the sampling time is increased.

18. The control method as claimed in claim 11, wherein in response to the third digital output not being equal to the third predetermined value, the sampling time is increased.

19. The control method as claimed in claim 11, wherein the first predetermined value is less than the second predetermined value, and the first predetermined value is equal to the third predetermined value.

20. The control method as claimed in claim 11, further comprising:

setting the sampling time to an initial value.

* * * * *